(12) United States Patent
Yindeepol et al.

(10) Patent No.: US 6,979,879 B1
(45) Date of Patent: *Dec. 27, 2005

(54) TRIM ZENER USING DOUBLE POLY PROCESS

(75) Inventors: Wipawan Yindeepol, Campbell, CA (US); Andy Strachan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/835,698

(22) Filed: Apr. 30, 2004

Related U.S. Application Data

(62) Division of application No. 10/041,112, filed on Jan. 8, 2002, now abandoned.

(51) Int. Cl.[7] .................................................. H01L 29/00
(52) U.S. Cl. ........................ 257/530; 257/529; 257/542
(58) Field of Search ................................ 257/529, 530, 257/542

(56) References Cited

U.S. PATENT DOCUMENTS

| | | | |
|---|---|---|---|
| 3,641,516 A | 2/1972 | Castrucci et al. ...... 340/173 SP |
| 4,196,228 A * | 4/1980 | Priel et al. ................... 438/383 |
| 4,316,319 A * | 2/1982 | Anantha et al. ............. 438/331 |
| 4,651,409 A | 3/1987 | Ellsworth et al. ......... 29/576 B |
| 5,019,878 A | 5/1991 | Yang et al. ................. 357/23.3 |
| 5,525,822 A | 6/1996 | Vinal .......................... 257/344 |
| 5,623,387 A | 4/1997 | Li et al. ........................ 361/56 |
| 5,915,179 A | 6/1999 | Etou et al. ................... 438/268 |
| 5,955,766 A | 9/1999 | Ibi et al. ...................... 257/367 |
| 6,218,722 B1 | 4/2001 | Cervin-Lawry et al. ..... 257/530 |
| 6,404,026 B2 | 6/2002 | Tsuyuki ....................... 257/409 |
| 6,563,189 B1 | 5/2003 | Dark et al. .................. 257/530 |
| 6,815,797 B1 * | 11/2004 | Dark et al. .................. 257/530 |

OTHER PUBLICATIONS

U.S. Appl. No. 10/042,811, filed Jan. 8, 2002, Charles A. Dark et al.

P. Beaud et al., "0.5um Technology Development and Qualification", [online], [retrieved on Dec. 14, 2003]. Retrieved from the Internet<URL:http://legwww.epfl.ch/research/pdf/05umf.pdf>, pp. 1-2 (unnumbered).

Donald T. Comer, "Zener Zap Anti-Fuse Trim in VLSI Circuits", VLSI Design, 1996, vol. 5, No. 1, pp. 89-100.

* cited by examiner

*Primary Examiner*—Jerome Jackson
(74) *Attorney, Agent, or Firm*—Mark C. Pickering

(57) ABSTRACT

In a zener zap diode device and a system for making such a device using a double poly process, p+ and n+regions are formed in a tub by means of p-doped and n-doped polysilicon regions, and a p-n junction is formed between the p+ region and an n-tub or between the n+ region and a p-tub. Cobalt or other refractory metal is reacted with silicon to form a silicide on at least the p-doped polysilicon region. By reverse biasing the p-n junction and establishing a sufficiently high zap current, the silicide can be forced to migrate across the junction to form a silicide bridge thereby selectively shorting out the p-n junction.

18 Claims, 3 Drawing Sheets

TRIM ZENER USING DOUBLE POLY PROCESS

This is a divisional application of Ser. No. 10/041,112 filed on Jan. 8, 2002, now abandoned.

FIELD OF THE INVENTION

The accuracy of analog integrated circuits is typically limited by the amount of control one has during the fabrication process over the absolute value and matching tolerances of the integrated devices. This is particularly true in the case of mixed signal VLSI in which both digital and analog circuits are present, but the yield is largely limited by the analog circuit. Furthermore, in mixed signal integrated circuits, the digital circuits determine most of the size of the device, thus the failure of a small analog section of a chip has drastic implications on the yield of the mixed signal design.

Trimming techniques have been developed to improve the accuracy and yield of integrated circuits. Trimming refers to the making of adjustments to the integrated circuit after its fabrication is complete.

One trimming method is the use of an anti-fuse approach that is applicable to both bipolar and CMOS designs. The term anti-fuse is used to describe an element which initially appears as an open-circuit but can be made to approach a short circuit by forcing conduction of a high-current for a short duration of time. Anti-fuse devices have been created in integrated circuits by various methods. One method creates anti-fuse devices by forcing a temporary avalanche breakdown in a p-n junction, sufficient to cause localized heating and subsequent migration of metal across the junction. This method of creating an anti-fuse is commonly referred to as zener zap.

FIG. 1 shows a typical application of zener zap diodes to achieve resistor trimming. Diodes 10 are connected in parallel with resistors 12 wherein each of the resistors 12 is made small compared to the total resistance of the resistor string. Pads 14 allow each of the individual zener zap diodes 10 to be contacted to apply the requisite current to convert the effective open circuit of the diode 10 to a short circuit. Commonly, zener zap diodes are created as illustrated in FIG. 2, with the cathode of the diode created as a circular diffusion with a contact 20. The cathode is typically heavily doped n-material, which may be 1–3 microns deep with sheet resistance of 5– 10 Ohms per square. In contrast, the anode 22 is created by a moderately doped p-diffusion, for example, 3–5 microns deep with sheet resistance of 100–200 Ohms per square. The metal interconnect 24 of the anode 22 presents a flat surface to the contact of the cathode 20. In this embodiment, the n+diffusion is placed inside the p-diffusion as in a conventional bipolar transistor device. This is also illustrated in a cross-section in FIG. 3 showing the cathode 20 in the anode 22. It will, however, be appreciated that other configurations may be used such as the one illustrated in FIG. 4. In this embodiment, the cathode 40 forms only a small overlap with the p diffusion of the anode 42.

It has been shown that for a diode doped as discussed with reference to FIGS. 2 and 3, where the n-material is heavily doped and the p-diffusion is only moderately doped, the p-material doping will determine the junction breakdown. The higher the doping of the p-material, the lower the breakdown voltage. Furthermore, since most fabrication processing creates a doping profile that results in maximum density at the surface of the doped material, the voltage breakdown typically occurs at the surface of the vertical p-n junction.

At breakdown, power is dissipated in the junction as given by the equation $$P = BVI$$

where I is the current conducted through the junction during breakdown, BV is the breakdown voltage, and P is the power dissipated in the junction. If no limit is placed on current I, the junction will heat rapidly and can destroy a number of mechanisms. On the other hand, if current I is limited, the power P will cause localized heating around the area where the current is concentrated. If current I is applied for a fixed time, sufficient heating can occur to cause migration of atoms of the metal interconnection from the cathode terminal to the anode terminal of the diode along the path of the breakdown current. This migration of metal establishes a trace of metal, typically aluminum, embedded in the silicon along the path of the current, near the surface. This electro migration of aluminum comprises two phases. During the first phase an initial breakdown and heating occurs during which the metal interconnect atoms are mobilized and begin to flow across the junction. The second phase involves the carrying of a sufficient number of the metal atoms to create a low resistance path through the silicon. One approach found to work well is to initiate the first phase with a high peak current of short duration, followed by a lower current of longer duration. For example, a current of 100–200 mA may be applied for 0.5–1 milliseconds followed by a current of 30–60 mA for a period of 2–3 milliseconds. Once the metal has migrated and created a current path, the zener zap diode is essentially short circuited. Thus, in a cascaded resistor network as illustrated in FIG. 1, the zener zap diodes 10 can be selectively short circuited by applying the appropriate high current to the pads 14.

As integrated circuits become ever smaller and bearing in mind the risk of electrostatic discharge (ESD) currents, the aluminum contacts pose the risk of unwanted migrations taking place in certain integrated circuit devices. As a result, aluminum contacts have been isolated from the silicon using tungsten plugs. By introducing the creation of tungsten plugs in the process, the migration of aluminum in zener zap diodes is, however, also prevented. What is needed is a way of producing a zener zap anti-fuse while dealing with the fact that the aluminum needs to be isolated from the silicon, for example, by the use of tungsten plugs.

Still further, according to the invention, there is provided a method of forming a zener zap diode device, comprising forming a first polysilicon layer on a n-type silicon, n-doping the first polysilicon layer, forming a second polysilicon layer on the n-type silicon, spaced from the first polysilicon layer, p-doping the second polysilicon layer, depositing a refractory metal layer on at least part of the second polysilicon layer, reacting the refractory metal with silicon to form a silicide, and establishing a current between the first and second polysilicon layers to create a silicided bridge formed from the metal silicide to form a low resistance path between contacts to the first and second polysilicon layers, wherein the steps are performed in an order suitable for a double poly process. Again, the polarities of the structures and dopants could instead be opposite to those described above.

DETAILED DESCRIPTION OF THE INVENTION

Figure 1:
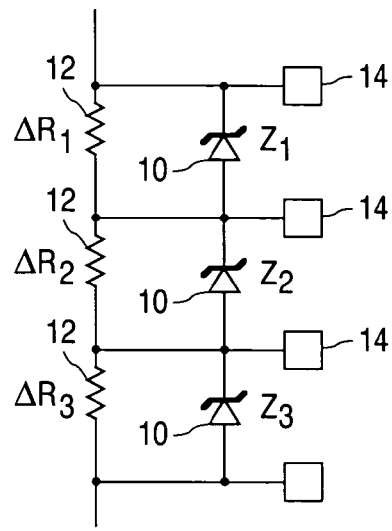
FIG. 1 is a schematic circuit diagram of a cascaded set of trim elements.
Figure 2:
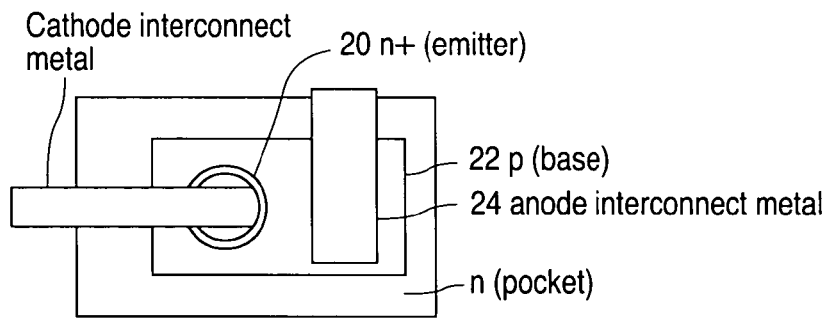
FIG. 2 is a plan view of one embodiment of a zener zap device of the prior art.
Figure 3:
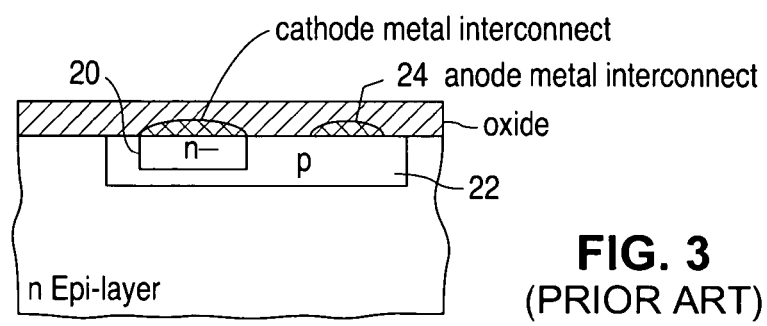
FIG. 3 is a sectional view of the device of FIG. 2.
Figure 4:
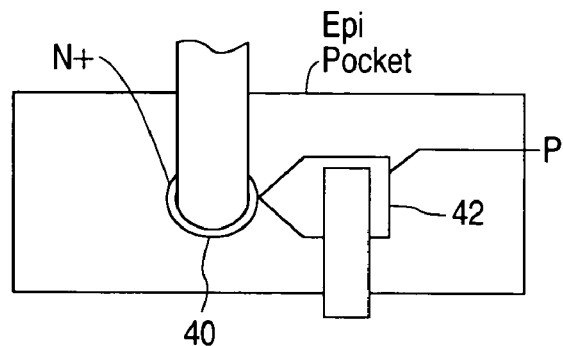
FIG. 4 is another prior art embodiment of a zener zap device shown in plan view.

The present invention provides a method and an architecture for forming a zener zap anti-fuse using a double poly process. According to the invention, a bipolar junction is created involving an n-doped region and a p-doped region that are in contact with a refractory metal such as cobalt which is reacted with the silicon to form a silicide metal.

The metal silicide, for example cobalt silicide, is caused to migrate across the bipolar junction to form a low resistance current path between contacts to the n-doped and p-doped polysilicon regions. The present invention seeks to make use of the normal double poly process steps and avoid the introduction of additional steps in forming the zener zap diode.

According to the invention, there is provided a zener zap diode device comprising a p-doped region formed in a tub, an n-doped region that is spaced from the p-doped region, thereby defining a p-n junction between the p-doped region and the tub or between the n-doped region and the tub depending on the doping of the tub, and a refractory metal silicide extending over part of at least the p-doped region, wherein the configuration of the device is such that the refractory metal silicide will form a silicide bridge across the p-n junction when a fusing current is established across the junction.

The diode device further includes a highly doped region in the tub which has the same polarity as the tub and extends partly between the p-doped and the n-doped regions without shorting out the p-n junction. One typical refractory metal silicide is cobalt silicide. Typically, the silicide bridge is formed to extend between the silicide on the p-doped region and silicide on the n-doped region or, if there is no silicide on the n-doped region, to a contact of the n-doped region.

The p-doped region may be formed by a p-doped polysilicon layer and the n-doped region may be formed by an n-doped polysilicon layer, and the p-doped polysilicon layer and the n-doped polysilicon layer may be part of two different polysilicon layers in a multi-poly process, or part of the same polysilicon layer in a multi-poly process.

The invention envisages that the configuration of the device is such that the distance across which the bridge has to be formed is sufficiently short and the resistance path across which the bridge has to be formed is sufficiently low so as to allow the fusing current to be sufficiently low to avoid undesirable damage to the device when the fusing current is established across the junction. The p-doped region may be formed by a p-doped polysilicon layer and the n-doped region may be formed by an n-doped polysilicon layer, wherein said n-doped polysilicon layer and p-doped polysilicon layer are spaced from each other by at least a nitride spacer.

Further, according to the invention, there is provided a zener zap diode device comprising a p-doped region formed in a tub, a n-doped region that is spaced from the p-doped region, thereby defining a p-n junction between the p-doped region and the tub or between the n-doped region and the tub depending on the doping of the tub, and a refractory metal silicide extending across the junction.

Still further, according to the invention, there is provided a zener zap diode device, comprising a p-n junction between a p-type material and an n-type material, a refractory metal silicide over at least the p-type material, an electric contact to the refractory metal silicide over the p-type material, an electric contact to the n-type material, and a highly doped region of the same polarity as the p-type material or n-type material extends at least partially through the p-type or n-type material to provide a lower resistance current path without shorting out the p-n junction, wherein the configuration of the device is such that the refractory metal silicide will form a silicide bridge across the p-n junction when a fusing current is established across the junction. Typically, the electric contact to the n-type material contacts the n-type material through at least a refractory metal silicide, and the highly doped region is typically formed in an epitaxial region or sinker region which forms the n-type or p-type region.

Still further, according to the invention, there is provided a zener zap diode device, comprising a first region of a first polarity formed in a tub of opposite polarity to define a p-n junction, a second region with the same polarity as the tub, spaced from the first region, and refractory metal silicide material in electrical contact with the first and second regions, wherein the configuration of the device is such that the refractory metal silicide will form a silicide bridge across the p-n junction when a fusing current is established across the junction.

Preferably, a highly doped region of the same polarity as the tub extends partially between the first region and the second region without shorting out the p-n junction. The tub may be an epitaxial region or a sinker region. The highly doped region extending partially between the first and second regions may be formed by a first poly layer in a double poly process, and the first and second regions may be formed by a second poly layer in a double poly process, or vice versa. The first and second regions may, instead, be formed by two different poly layers in a double poly process.

Still further, according to the invention, there is provided a method of forming a zener zap diode device, comprising forming a first polysilicon layer on an n-type silicon material, n-doping the first polysilicon layer, forming a second polysilicon layer on the n-type silicon material to lie substantially on either side of the first layer, n-doping a first portion of the second poly silicon layer, p-doping a second portion of the second polysilicon layer, depositing a refractory metal layer on at least the second polysilicon layer, reacting the refractory metal with silicon of the second polysilicon layer to form a silicide, and establishing a current between the first and second portions of the second polysilicon layer to establish a silicide bridge made from the refractory metal silicide to provide a low resistance path between contacts to the first and second portions, wherein the first and second polysilicon layers are formed in any order and the doping is performed at any stage that is appropriate in the process. The refractory metal may be cobalt and the silicide bridge comprises a cobalt silicide bridge. The polarities of the structures and dopants could instead be opposite to those described above.

Still further, according to the invention, there is provided a method of forming a zener zap diode device, comprising forming a first polysilicon layer on an n-type silicon, n-doping the first polysilicon layer, forming a second polysilicon layer on the n-type silicon, spaced from the first polysilicon layer, p-doping the second polysilicon layer, depositing a refractory metal layer on at least part of the second polysilicon layer, reacting the refractory metal with silicon to form a silicide, and establishing a current between the first and second polysilicon layers to establish a silicided bridge formed from the metal silicide to form a low resistance path between contacts to the first and second polysilicon layers, wherein the steps are performed in an order suitable for a double poly process. Again, the polarities of the structures and dopants could instead be opposite to those described above.

Figure 5:
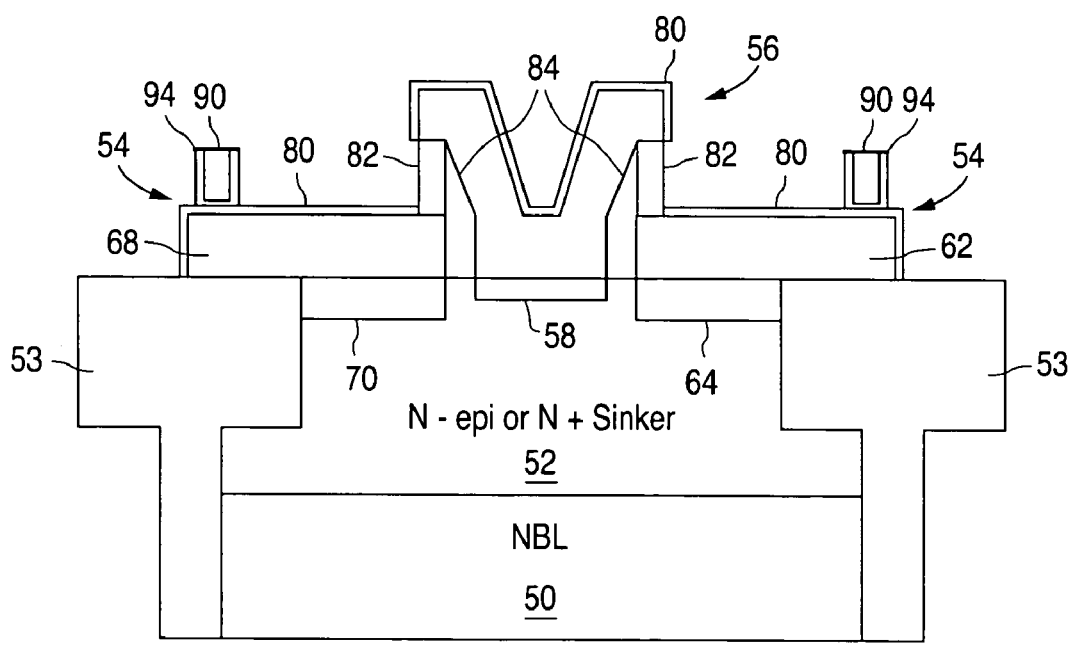
FIG. 5 shows a sectional view of one embodiment of a trim zener of the invention.

FIG. 5 shows an example of a device comprising an n-buried layer (NBL) 50 formed in a substrate. An n-epitaxial or n+ sinker region 52 is formed on n-buried layer 50. Region 52, in turn, is isolated from laterally adjacent regions by isolation region 53. Two polysilicon layers are formed on n-epitaxial or n+ sinker region 52 in creating the device: a first poly layer 54, and a second poly layer 56. In this embodiment, the first poly layer 54 is formed first and is therefore depicted as poly 1, while the second poly layer is formed after the first poly layer 54 and is therefore depicted as poly 2. The second poly layer 56 is n-doped to form an n+ region 58, such as an emitter, in the n-epitaxial or n+ sinker region 52. The first poly layer 54 comprises two portions which are oppositely doped in this embodiment. A first portion 62 of the first polysilicon layer 54 is p-doped to form a p+region 64 in the n-epitaxial region or n+sinker 52. A second portion 68 of the first polysilicon layer 54 is n-doped to define an n+ region 70 in the n-epitaxial or n+sinker region 52. A p-n junction is established in this embodiment by p+ region 64 and the n-epitaxial or n+sinker region 52 which is contacted through n+ region 70 and the n-doped poly 1 portion 68.

FIG. 5 further shows a silicided refractory metal layer 80 which, in this case, is a Cobalt silicide layer. In practice, Cobalt or another refractory metal is blanket deposited on the device and thereafter reacted at elevated temperatures with the silicon to form the silicide. The unreacted Cobalt or other refractory metal is then etched off leaving only the areas of Cobalt silicide on the polysilicon areas. The silicide at this point in the process is often referred to as salicide. As can be seen in FIG. 5, the Cobalt silicide layer is formed on top of the first and second polysilicon layers but does not extend over the oxide dielectric 82. In this way oxide dielectric 82 prevents the Cobalt silicide from shorting out the p-n junction prematurely. As can be seen, the regions 62 and 68 are also isolated from the second polysilicon region 56 by the nitride spacers 84. However, a low resistance path is facilitated by n+region 58. Thus, when the device is reverse biased by applying a voltage across the contacts 90, which in this embodiment comprise aluminum contacts formed in titanium nitride (TiN) sleeves 94, a fusing current is established which heats the p-n junction and causes the Cobalt silicide to migrate across the p-n junction to form a silicide bridge, in this case a Cobalt silicide bridge. Thus, by using standard process steps in a double poly process and modifying the resistance path across n-epitaxial or n+ sinker region 52, Cobalt or another refractory metal can be used to establish a silicide bridge across the p-n junction thereby effectively shorting out the p-n junction. Thus, the present invention allows the device to be used as a zener zap diode.

Figure 6:
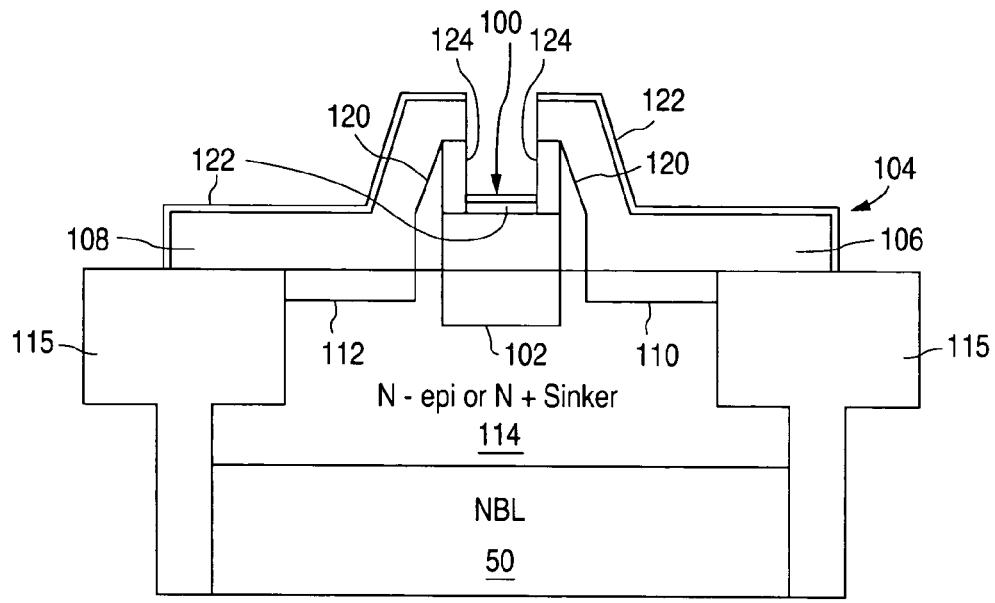
FIG. 6 shows a sectional view of another embodiment of a trim zener of the invention.

Another embodiment of the invention is illustrated in the FIG. 6 example showing a device comprising an n-buried layer (NBL) 50 formed in a substrate. An n-epitaxial or n+ sinker region 114 is formed on n-buried layer 50. Region 114, in turn, is isolated from laterally adjacent regions by isolation region 115. Two polysilicon layers are formed in on n-epitaxial or n+ sinker region 114 in creating the device. The first polysilicon layer (poly 1) 100 is used to form an n+ region 102. The second polysilicon layer (poly 2) 104 includes a p-doped region 106 and an n-doped portion 108. The two polysilicon regions 106 and 108 form a p+ region 110 and an n+ region 112, respectively, in n-epitaxial or n+ sinker region 114. The p+ region 110 and n+ region 112 can be formed, for example, as emitters in the case of bipolar devices, or as drains and sources in the case of MOS devices. A p-n junction is established in this embodiment by the p+ region 110 and the n-epitaxial or n+ sinker region 114 which is contacted through the n+ region 112 and the n-doped poly 2 portion 108. Again, the poly 2 portions 106 and 108 are spaced from the poly 1 layer 100 by means of nitride spacers 120. The Cobalt silicide or other silicided refractory metal 122 extends across the first and second poly layers 100 and 104. By virtue of the oxide dielectric 124, the Cobalt silicide is prevented from shorting out the p-n junction prematurely. Again, a silicide bridge can be established across the p-n junction by migrating the Cobalt silicide atoms across the p-n junction from the p-doped poly 2 portion 106 to the n-doped poly 2 portion 108.

Figure 7:
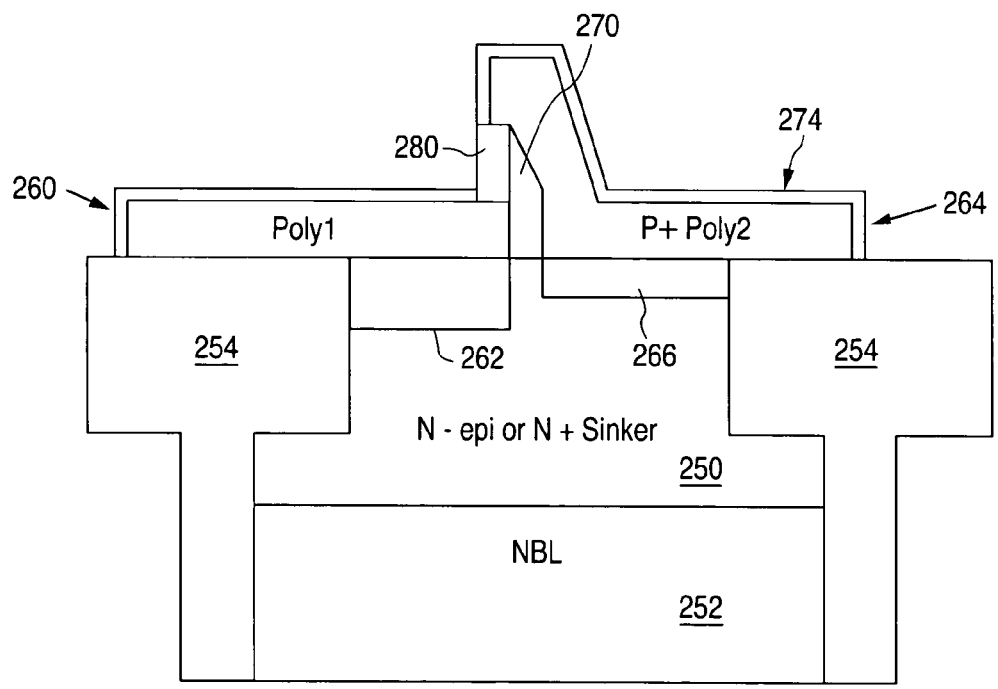
FIG. 7 shows a sectional view of yet another embodiment of a trim zener of the invention.

FIG. 7 shows an example of yet another embodiment of the invention. An n-tub in the form of a n-epitaxial or n+ sinker region 250 is bounded on its lower surface by a n-buried layer (NBL) 252 and on its sides by oxide regions 254. In this embodiment the first formed polysilicon layer (poly 1) 260 is n-doped to form an n+ region 262 in the tub 250. The second formed polysilicon layer 264 is p-doped to form a p+ region 266 in the tub 250. The p+ region could be formed when, for example, as an emitter in the case of a bipolar device, or as a source or drain in the case of a MOS device. The second formed polysilicon layer 264 (poly 2) is spaced from the poly 1 region 260 by a nitride spacer 270 to define a p-n junction between the p+ region 266 and the n-epitaxial or n+ sinker region 250 which is contacted through n+ region 262 and n-doped poly 1 layer 260. A Cobalt silicide layer 274 or other silicided refractory metal is formed on top of the polysilicon layers 264 and 260. Again an oxide region, in this case oxide region 280, prevents the Cobalt silicide from shorting out the p-n junction prematurely. Again, this device can be used as an anti-fuse in accordance with the invention by selectively shorting out the p-n junction by applying a reverse voltage across the p-n junction to cause electrons to flow from the p+ polysilicon region 264 to the n+ polysilicon region 260 thereby causing Cobalt silicide atoms to migrate across the junction to form a Cobalt silicide bridge that shorts out the p-n junction. It will be appreciated that the Cobalt silicide layer need only be formed on the p+ polysilicon region 264, however, a typical process will usually form the Cobalt silicide on both polysilicon layers 264 and 260. This also has the advantage that the silicide bridge need only extend from the cobalt silicide layer on the p+ polysilicon region to the cobalt silicide layer on the n+ polysilicon region instead of all the way to the actual contact. Thus, the length of the bridge is reduced, which is one of the considerations of the invention in providing a configuration that will allow a bridge to be formed under sufficiently low zap currents so as to avoid unwanted damage to the structure.

While the embodiment of FIG. 5 referred specifically to a bipolar process, the present invention is equally applicable to CMOS processes. It will further be appreciated that in each case a p-n junction exists that creates the diode in each of the various embodiments.

In the embodiment of FIG. 5, the contacts were aluminum contacts in a titanium nitride (TiN) sleeve. It will be appreciated, however, that other contacts can be formed. For example, tungsten plugs connected to aluminum contacts can be formed by depositing a dielectric, etching windows into the dielectric, depositing a plug liner, growing tungsten plugs in the windows, appropriately etching back, depositing a metal slab, and appropriately masking and etching the metal layer.

Also, n-buried layers were shown in the examples of FIGS. 5–7. The invention could, however, also be implemented with a p-buried layer depending substrate used. Thus, while specific examples were discussed above, it will be appreciated that the present invention can be implemented with different devices by reversing the doping type. More generally, while specific examples were discussed above, it will be appreciated that the present invention can be implemented in a variety of ways without departing from the scope of the claims. Even in the case of multiple polysilicon layer processes, various configurations of the present invention can be devised without departing from the scope of the claims. Portions of the same or different polysilicon layers can be appropriately doped to define the contact regions to the p-n junction, and the device can be configured so as to facilitate the formation of a silicide bridge that is sufficiently short so that under zap currents the current does not otherwise damage the zener zap diode other than selectively shorting the device across the p-n junction by establishing the silicide bridge. This appropriate configuration of the structure is achieved by appropriately positioning the elements across which the bridge has to be formed and, when necessary, establishing a lower resistance path in the tub by establishing a highly doped region in the tub having the same polarity as the tub, e.g. a n+ region in a n-tub or a p+ region in a p-tub, wherein the highly doped region extends partially across the tub while avoiding shorting out the p-n junction.

What is claimed is:

1. A semiconductor device comprising:
   a semiconductor material having a surface and including:
   a first region of a first conductivity type that contacts a first area of the surface,
   a second region of a second conductivity type that contacts the surface and the first region, the second region including all contiguous regions that have the second conductivity type, no region of a first conductivity type being enclosed between the second region and the surface, and
   a third region of the first conductivity type that contacts a second area of the surface and the first region, the first and second areas being spaced apart; and
   a first conductor formed on the surface to make an electrical connection with the first region and the third region, the first conductor having the first conductivity type and a dopant concentration;
   a second conductor formed on the surface, the second conductor contacting the second region and being spaced apart from the first conductor; and
   a third conductor formed on the surface between and spaced apart from the first and second conductors.

2. The semiconductor device of claim 1 wherein the second conductor includes a layer of metal silicide.

3. The semiconductor device of claim 2 wherein the second conductor includes a first polysilicon region of the second conductivity type that contacts the layer of metal silicide and the second region.

4. The semiconductor device of claim 3 wherein the first conductor includes:
   a second polysilicon region of the first conductivity type that contacts the surface, the second polysilicon region having a dopant concentration; and
   a metal silicide layer that contacts the second polysilcion region.

5. The semiconductor device of claim 2 wherein the second conductor has a first end and a second end, and wherein the first end is substantially higher than the second end.

6. The semiconductor device of claim 2 wherein a portion of the second conductor vertically overlies and is isolated from the third conductor.

7. The semiconductor device of claim 2 wherein the third conductor includes:
   a third polysilicon region of the first conductivity type that contacts the surface, the third polysilicon region having a dopant concentration; and
   a layer of metal silicide that contacts the third polysilicon region.

8. The semiconductor device of claim 7 wherein a portion of the third conductor lies vertically over the first and second conductors.

9. The semiconductor device of claim 7 wherein the third conductor lies vertically under the first and second conductors.

10. A semiconductor device comprising:
    a semiconductor material having a surface and a first conductivity type;
    a first region of the first conductivity type located in the semiconductor material, the first region contacting the surface;
    a second region of a second conductivity type located in the semiconductor material, the second region contacting the surface and being spaced apart from the first region;
    a third region of the first conductivity type located in the semiconductor material, the third region contacting the surface, being spaced apart from the first and second regions, and lying between the first and second regions, the third region being located such that no region of the second conductivity type lies between the first region and the third region;
    a first polysilicon segment that contacts the surface and the first region;
    a first layer of metal silicide located on the first polysilicon segment;
    a second polysilicon segment that contacts the surface and the second region, the second polysilicon segment being spaced apart from the first polysilicon segment; and
    a third polysilicon segment that contacts the surface and the third region, the third polysilicon segment being spaced apart from the first and second polysilicon segments, and lying between the first and second polysilicon segments.

11. The semiconductor device of claim 10 wherein the third polysilicon segment has a first portion and a second portion, and wherein the first portion is substantially higher than the second portion.

12. The semiconductor device of claim 10 wherein a first portion of the third polysilicon segment vertically overlies and is isolated from the first polysilicon segment, and a second portion of the third polysilicon segment vertically overlies and is isolated from the second polysilicon segment.

13. The semiconductor device of claim 10 wherein:
the semiconductor material has a dopant concentration;
the third region has a dopant concentration that is greater than the dopant concentration of the semiconductor material;
the first polysilicon segment has the first conductivity type;
the second polysilicon segment has the second conductivity type; and
the third polysilicon segment has the first conductivity type.

14. The semiconductor device of claim 10 wherein a portion of the first polysilicon segment and a portion of the second polysilicon segment lie vertically over the third polysilicon segment.

15. The semiconductor device of claim 10 wherein the third polysilicon segment lies vertically under a portion of the first polysilicon segment and a portion of the second polysilicon segment.

16. The semiconductor device of claim 14 wherein:
the semiconductor material has a dopant concentration;
the first region has a dopant concentration that is greater than the dopant concentration of the semiconductor material;
the first polysilicon segment has the first conductivity type;
the second polysilicon segment has the second conductivity type; and
the third polysilicon segment has the first conductivity type.

17. A method of operating a semiconductor device, the semiconductor device comprising:
a semiconductor material having a surface and a first conductivity type;
a first region of the first conductivity type located in the semiconductor material, the first region contacting the surface;
a second region of a second conductivity type located in the semiconductor material, the second region contacting the surface and being spaced apart from the first region;
a third region of the first conductivity type located in the semiconductor material, the third region contacting the surface, being spaced apart from the first and second regions, and lying between the first and second regions, the third region being located such that no region of the second conductivity type lies between the first region and the third region;
a first polysilicon segment that contacts the surface and the first region;
a second polysilicon segment that contacts the surface and the second region, the second polysilicon segment being spaced apart from the first polysilicon segment;
a third polysilicon segment that contacts the surface and the third region, the third polysilicon segment being spaced apart from the first and second polysilicon segments, and lying between the first and second polysilicon segments;
a first layer of metal silicide located on the first polysilicon segment; and
a second layer of metal silicide located on the second polysilicon segment, the method comprising the steps of:
applying a first voltage to the first layer of metal silicide; and
applying a second voltage to the second layer of metal silicide, the first and second voltages causing a reverse breakdown of a junction between the second region and the semiconductor material such that metal atoms from a layer of metal silicide migrate to form a metallic path through the junction.

18. The method of claim 17 wherein the metallic path extends from the first poly silicon segment to the second polysilicon segment.

* * * * *

UNITED STATES PATENT AND TRADEMARK OFFICE
CERTIFICATE OF CORRECTION

| | | |
|---|---|---|
| PATENT NO. | : 6,979,879 B1 | Page 1 of 1 |
| APPLICATION NO. | : 10/835698 | |
| DATED | : December 27, 2005 | |
| INVENTOR(S) | : Yindeepol et al. | |

It is certified that error appears in the above-identified patent and that said Letters Patent is hereby corrected as shown below:

Column 2,
Line 49, cancel the text beginning with "Still further, according" through an ending with "those described above" in column 2, line 63.

Column 6,
Line 33, delete "formed when, for example, as an emitter in the" and replace with -- formed, for example, as an emitter, in the --.

Signed and Sealed this

Twentieth Day of June, 2006

JON W. DUDAS
*Director of the United States Patent and Trademark Office*